United States Patent [19]
Sato

[11] Patent Number: 5,983,479
[45] Date of Patent: *Nov. 16, 1999

[54] APPARATUS AND METHOD OF AUTOMATICALLY REMOVING A WAFER CARRIER FROM A CONTAINER

[75] Inventor: Akira Sato, Yamagata, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/803,668

[22] Filed: Feb. 21, 1997

[30] Foreign Application Priority Data

Feb. 21, 1996 [JP] Japan ................................. 8-033884

[51] Int. Cl.⁶ ............................................. B23P 19/00
[52] U.S. Cl. ........................ 29/426.1; 414/940; 414/814
[58] Field of Search .................... 29/426.1; 414/618, 414/940, 800, 814

[56] References Cited

U.S. PATENT DOCUMENTS

| | | | |
|---|---|---|---|
| 3,938,846 | 2/1976 | Yuryan | 414/618 X |
| 5,028,195 | 7/1991 | Ishii et al. | 414/940 X |
| 5,123,804 | 6/1992 | Ishii et al. | 414/940 X |
| 5,460,478 | 10/1995 | Akimoto et al. | |
| 5,498,118 | 3/1996 | Nakahara. | |
| 5,628,604 | 5/1997 | Murata et al. | 414/940 X |

FOREIGN PATENT DOCUMENTS

| | | | |
|---|---|---|---|
| 63-150932 | 6/1988 | Japan | 414/940 |
| 1-267202 | 10/1989 | Japan | 414/940 |
| 5-146984 | 6/1993 | Japan | 414/940 |

Primary Examiner—David P. Bryant

[57] ABSTRACT

First and second pairs of jaws are located above the second pair by a predetermined amount. The first pair of jaws is arranged to grasp the lid of a container while the second pair of jaws is arranged to grasp a carrier disposed in the container. A vertically extending column is adapted to be moved laterally along a predetermined path and for supporting the first and second pairs of jaws. A jaw vertically moving controller is provided so as to lift and lower the first and second pairs of jaws along the column. On the other hand, a jaw controller is provided so as to selectively and respectively open and close the first and second pairs of jaws.

3 Claims, 7 Drawing Sheets

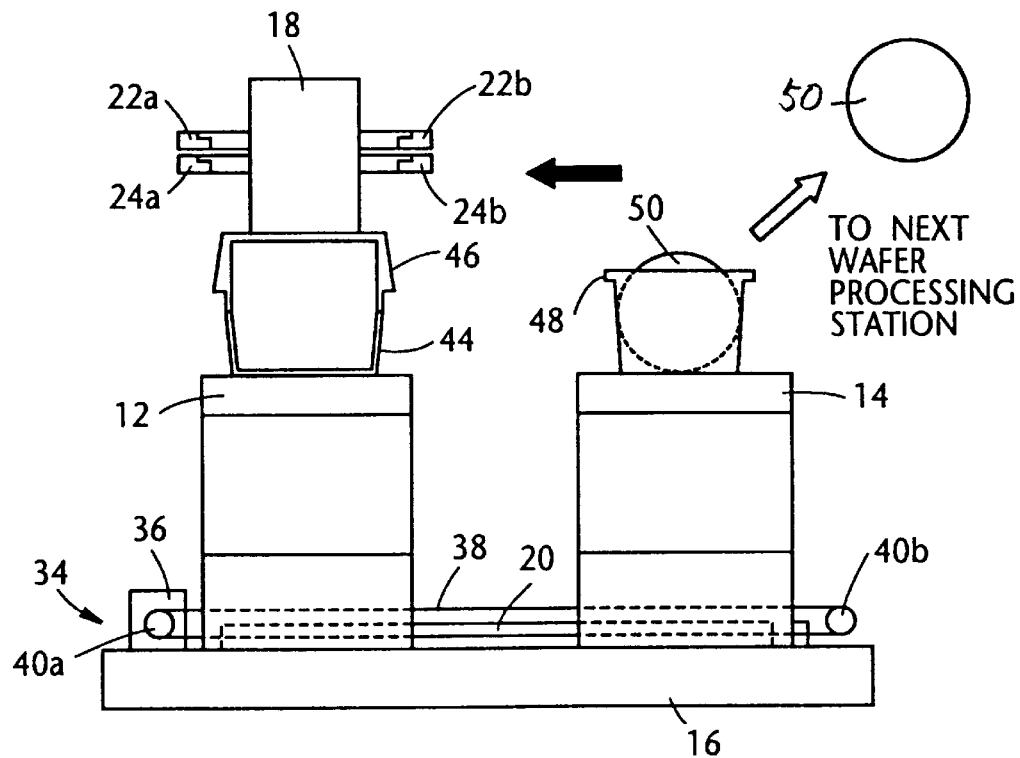
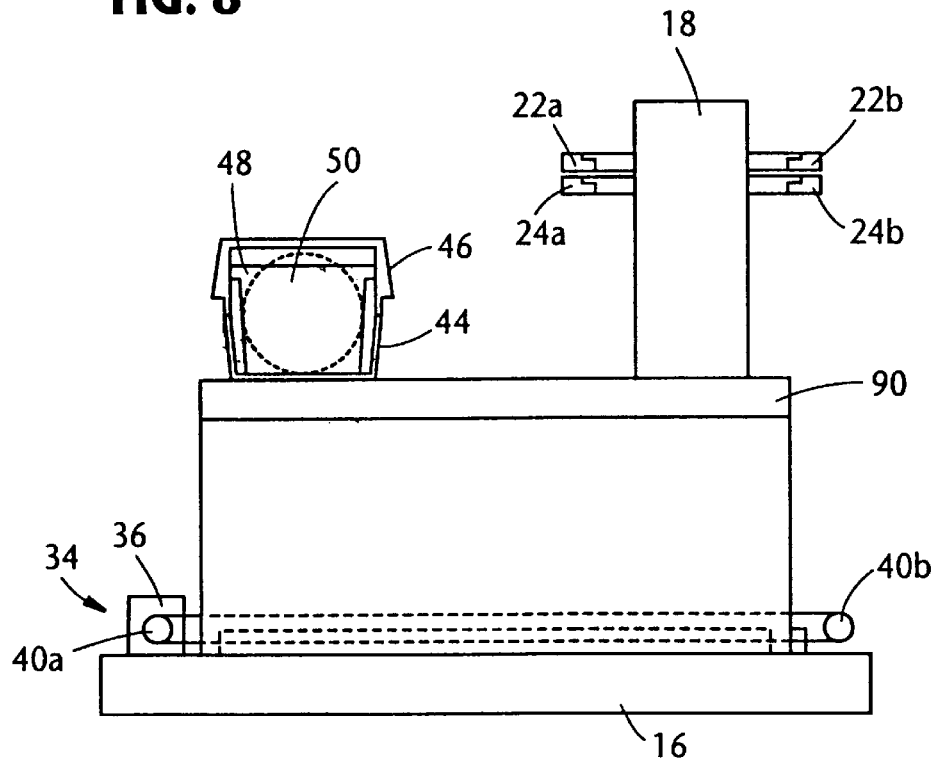

APPARATUS AND METHOD OF AUTOMATICALLY REMOVING A WAFER CARRIER FROM A CONTAINER

BACKGOUND OF THE INVENTION

1. Field of the Invention

The present invention relates generally to an apparatus and method of handling a wafer carrier which carries therein a plurality of semiconductor wafers, and more specifically to an apparatus and method of removing a wafer carrier from a container. It is to be noted that the present invention is also applicable to the case wherein a wafer carrier is automatically disposed in an empty container.

2. Description of the Related Art

As is well known in the art, IC (integrated circuit) fabrication consists of a variety of processing steps that add, alter, and remove thin layers in the selected regions. During the wafer processing, it is necessary to transport a plurality of wafers using a wafer carrier from one wafer processing station to another. Many of the wafer processing sequences for integrated circuits are implemented in a clean room. However, it is practically impossible to completely prevent airborne particles from becoming attached to the wafers due to the exposed nature with which the wafers are transported.

Therefore, although the wafer conveying efficiency is sacrificed, a wafer carrier is disposed in a container or box which is closed by a lid during wafer transportation. However, if the wafer carrier is manually disposed in the container or removed therefrom, there is a high possibility that the wafers may be contaminated by airborne particles. It is therefore highly desirable to remove a wafer carrier from a container or vice versa without relying on manual handling.

Japanese Utility Model Application laid-open under the publication No. 63-73935 discloses a carrier conveying apparatus which involves a transfer unit which transfers a carrier in one direction and a lid delivering unit which opens and closes a lid of a container and places the lid in a position that is perpendicular to the above mentioned direction. Thus, the carrier is allowed to be automatically taken out and conveyed without relying upon manual labor.

However, the above mentioned conventional carrier conveying apparatus suffers from the drawback that the lid delivering unit and the carrier transfer unit are installed independently of each other. Therefore, different sequential operations are required to prevent them from interfering with each other. As a result, the operation speed is undesirably lowered. In addition, the installation of such mechanism for movement in the mutually perpendicular directions causes the size of the apparatus to be enlarged and hence requires a large floor space. Moreover, the complicated two-way moving mechanism needs frequent maintenance, thereby to raise the manufacturing cost in addition to the increase in size and the complexity of the mechanism.

SUMMARY OF THE INVENTION

It is therefore an object of the present invention to provide a carrier handling apparatus which automatically removes a wafer carrier from a container with a very simple arrangement.

One aspect of the present invention resides in a carrier handling apparatus comprising; first and second pairs of jaws, the first pair of jaws being located above the second pair by a predetermined amount, the first pair of jaws being arranged to grasp the lid of a container, the second pair of jaws being arranged to grasp a carrier disposed in the container; column means adapted to be moved laterally along a predetermined path and for supporting the first and second pairs of jaws; jaw vertically moving means for lifting and lowering the first and second pairs of jaws along the column means; and jaw control means for selectively and respectively opening and closing the first and second pairs of jaws.

Another aspect of the present invention resides in a method of handling a carrier, comprising the steps of: grasping a lid which closes a container with a first pair of jaws; grasping a carrier which is disposed in the container with a second pair of jaws; moving the first and second pairs of jaws vertically upward to simultaneously lift the lid and the carrier upward from the container, in a manner wherein the lid remains on top of the carrier obviating dust contamination of items carried in the carrier; moving the first and second pairs of jaws laterally to move the lid and the carrier to a position located above a predetermined site; lowering the first and second pairs of jaws until the carrier rests on the predetermined site; releasing the second pair of jaws while maintaining the first pair of jaws in a closed condition wherein the lid remains gripped thereby; moving the first and second pairs of jaws to a position located above the container; and lowering the first and second pairs of jaws until the lid sits on top of the container in a manner wherein it again closes the container.

BRIEF DESCRIPTION OF THE DRAWINGS

The feature and advantages of the present invention will become more clearly appreciated from the following description taken in conjuction with the accompanying drawings in which like members or elements are denoted by like reference numerals and in which:

FIGS. 5–7 are diagrams schematically showing the operations of the apparatus of FIGS. 1 and 2;

FIG. 8 is a diagram showing a variant of the embodiment of FIGS. 1–7; and

DETAILED DESCRIPTION OF THE PREFERRED EMBODIMENTS

A preferred embodiment of the present invention will be described with reference to the accompanying drawings.

Figure 1:
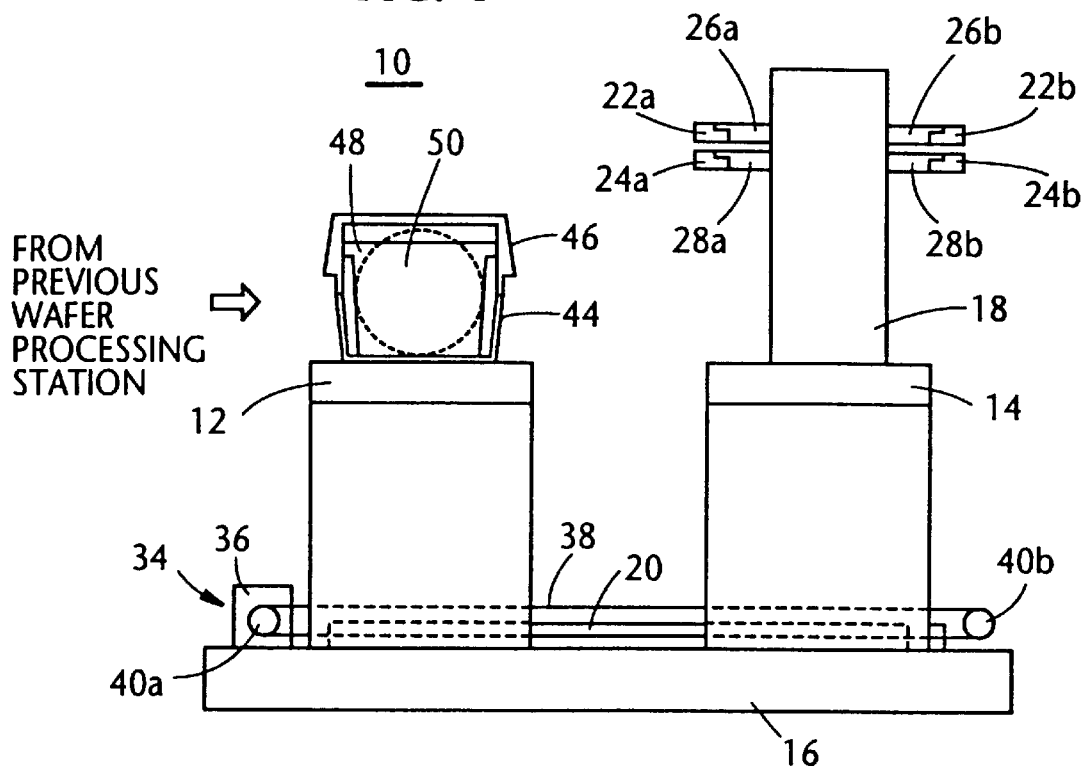
FIG. 1 is a front elevation showing an apparatus according to an embodiment of the present invention.
Figure 2:
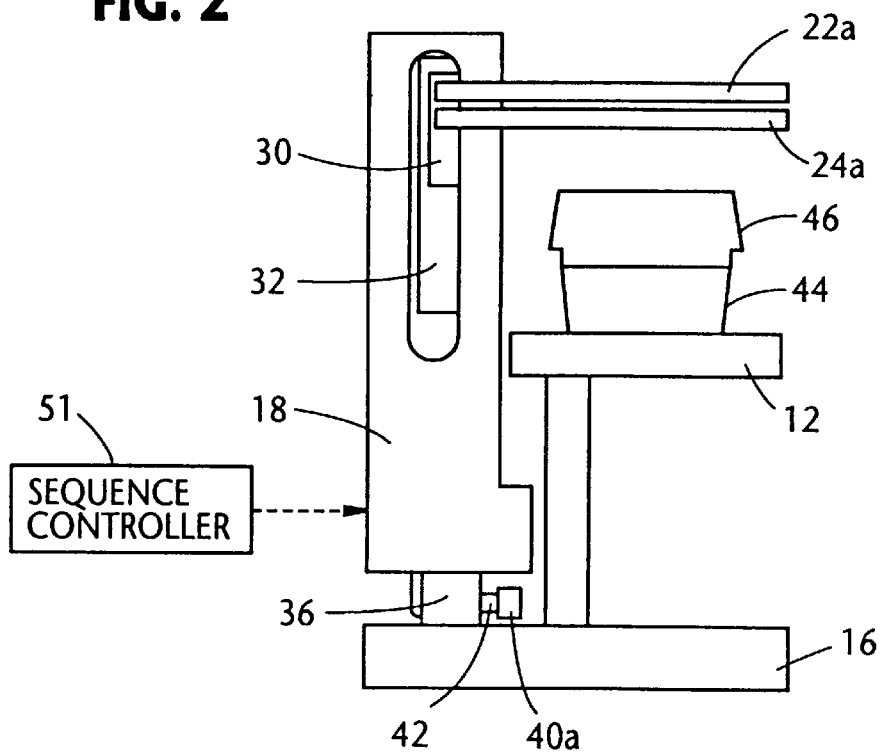
FIG. 2 is a side elevation of the apparatus of FIG. 1.

FIGS. 1 and 2 are respectively front and side elevational views which schematically illustrate a carrier handling apparatus 10 embodying the present invention. In the instant disclosure, the carrier handling apparatus implies an apparatus for removing a wafer carrier from a container and vice versa (viz., depositing the wafer carrier in the container), both without the need of human's handling.

Figure 3:
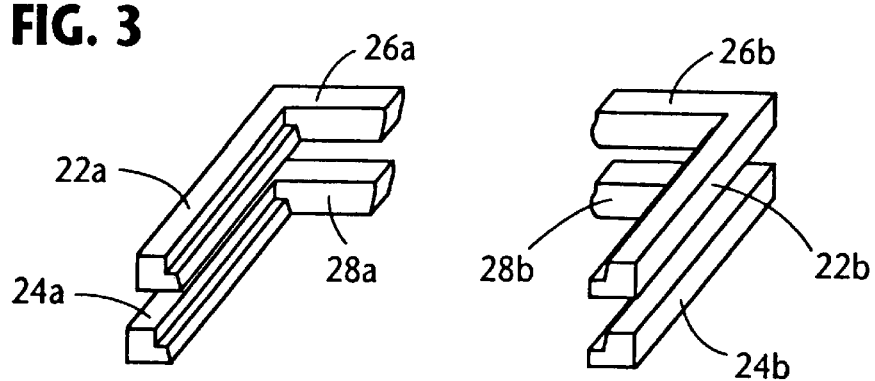
FIG. 3 is a perspective of two pairs of jaws of FIGS. 1 and 2.

As shown in FIGS. 1 and 2, the carrier handling apparatus 10 generally comprises two separate tables 12 and 14 both fixed to a base 16, and a vertically extending column 18 which is movable horizontally (viz., laterally) along a rail 20 deposited on the base 16. The carrier handling apparatus 10 further comprises first and second pairs of jaws 22a–22b and 24a–24b, which are separated by a predetermined distance with each other. As best shown in FIG. 3, the jaws 22a–22b are respectively fixed to or integrated with rods or arms 26a and 26b. Similarly, the other jaws 24a–24b are respectively fixed to or integrated with rods or arms 28a and 28b. Although not shown in detail in FIGS. 1–3, the first and second pairs of jaws 22a–22b and 24a–24b are operatively supported by or connected to a jaw control mechanism 30 which will be discussed later with reference to FIG. 4.

The first pair of jaws 22a–22b is arranged such as to be vertically movable as well as to be horizontally movable toward and away (viz., reciprocal) with respect to each other. Same description holds for the second pair of jaws 24a–24b.

The jaw control mechanism 30 operates such as to open and close the first and second pairs of jaws 22a–22b and 24a–24b. The control mechanism 30 is vertically movable by way of a jaw vertically moving mechanism 32 installed in the column 18. Therefore, the two pairs of jaws 22a–22b and 24a–24b are movable vertically with respect to each of the tables 12 and 14.

The column 18 is designed to be movable along the rail 20 through a column traveling mechanism 34 which includes a motor 36, a chain 38, and chain sprockets 40a and 40b operatively connected to the chain 38. In FIG. 2, a reference numeral 42 depicts a motor shaft.

As shown in FIGS. 1 and 2, a container 44 which is covered by a lid 46 and carries therein a wafer carrier 48, is deposited on the table 12. The wafer carrier 48 accommodates therein a plurality of wafers 50 (only one wafer is shown in a phantom line). By way of example, the container 44 is transferred from a previous wafer processing station preferably through a suitable automatic container conveying apparatus which, however, is not concerned with the instant invention and as such no further description thereof is not given in the instant disclosure.

A sequence controller 51 is connected such as to control the overall operations of the wafer handling apparatus 10. The controller 51 per se can readily understood by a person of ordinary skill in the art as the description proceeds.

The jaw control mechanism 30 and the jaw vertically moving mechanism 32 will be described with reference to FIG. 4.

Figure 4:
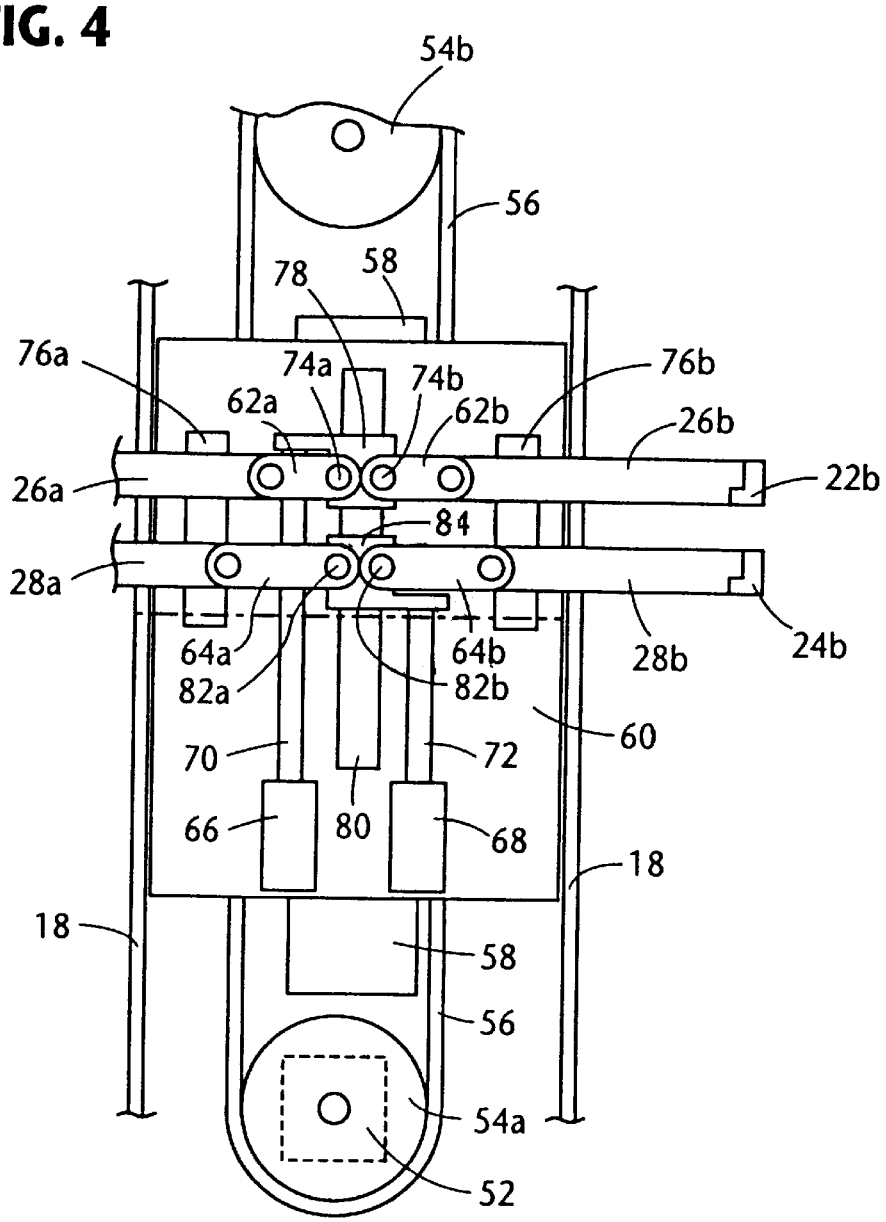
FIG. 4 is a diagram showing details of jaw control mechanism of FIGS. 1 and 2.

As shown in FIG. 4, the jaw vertically moving mechanism 32 (shown in FIG. 2) includes a motor 52 secured to a suitable portion of the column 18, two sprockets 54a and 54b (the sprocket 58a is driven by the motor 52), a chain 56 driven by the sprockets 54a and 54b, and a guide member 58.

On the other hand, the jaw control mechanism 30 (shown in FIG. 2) includes a base 60 which is vertically driven along the guide member 58 by the chain 56 of the jaw vertically moving mechanism 32, whereby the base 60 is vertically movable within the column 18. Further, the jaw control mechanism 30 is equipped with a first pair of links 62a–62b for opening and closing the first pair of jaws 22a–22b, and a second pair of links 64a–64b for opening and closing the second pair of jaws 24a–24b. These pairs of links 62a–62b and 64a–64b are respectively driven by air cylinder devices 66 and 68 which have respectively piston rods 70 and 72.

FIG. 4 shows that the first and second pairs of jaws 22a–22b and 24a–24b (only jaws 22b and 24b are shown in FIG. 4) are maximally open (most separated). More specifically, when the piston rod 70 protrudes upwardly to rotate the links 62a and 62b upwardly about pins 74a and 74b, respectively, the rods 26a and 26b of the first pair of jaws 22a–22b slide respectively along guide members 76a and 76b in the jaw closing (approaching) directions. Therefore, the jaws 22a and 22b shift toward the column 18. In the above, the piston rod 70 is fixed to a sliding member 78 which is slidable along a guide member 80.

On the other hand, when the piston rod 72 is lowered to rotate the links 64a and 64b downward about pins 82a and 82b, respectively, the rods 28a and 28b of the second pair of jaws 24a–24b slide respectively along the guide members 76a and 76b in the jaw closing (approaching) directions. Therefore, the jaws 24a and 24b shift toward the column 18. The piston rod 72 is fixed to a sliding member 84 which is slidable along the guide member Referring to FIGS. 5–7, there is schematically illustrated a manner wherein the wafer carrier 48 is transferred from the table 12 to the table 14. The detailed description of the transfer of the wafer carrier 48 will be given with reference to FIGS. 9A–9L.

Figure 5:
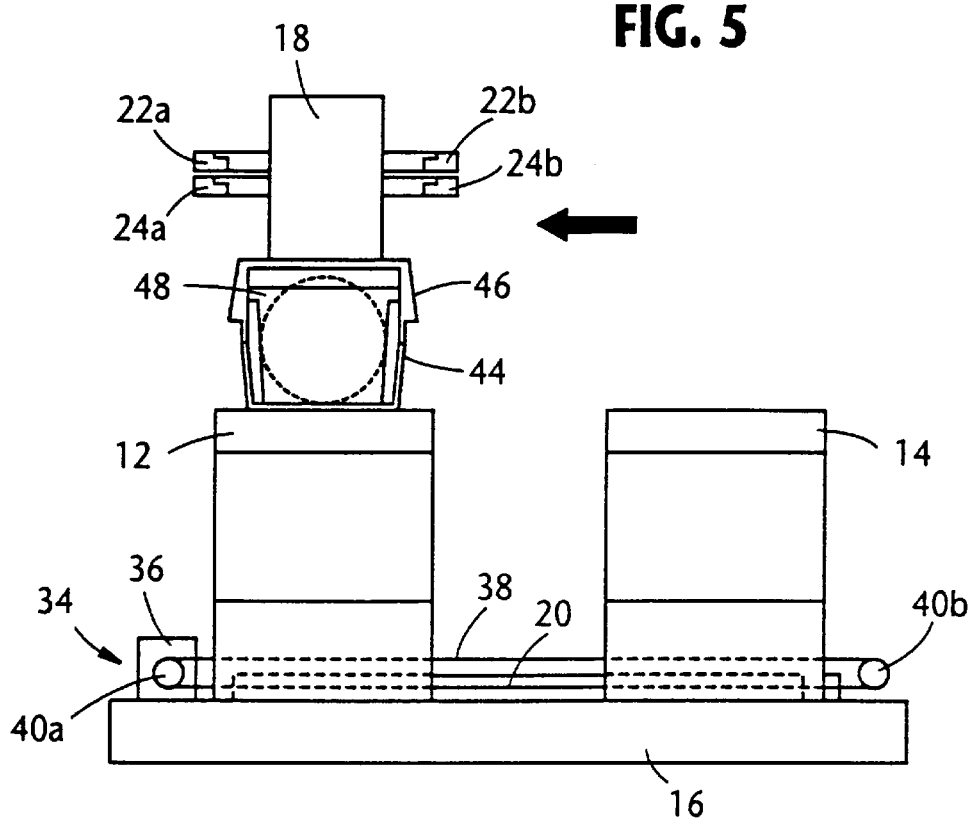
Figure 6:
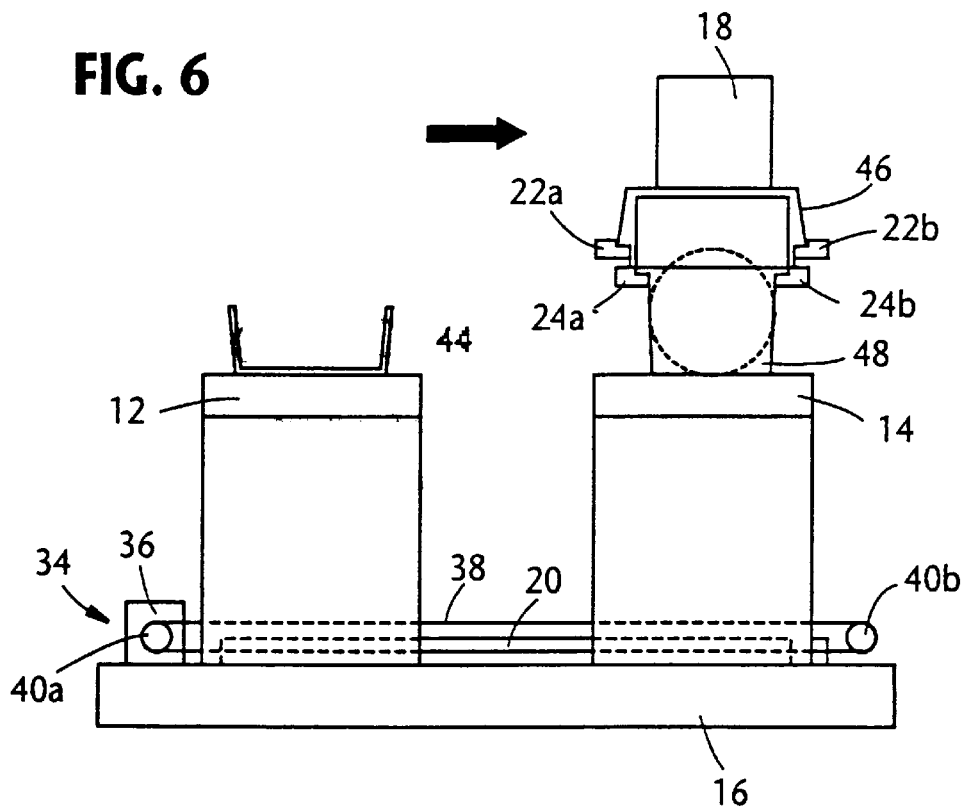

As shown in FIG. 5, the column 18 is shifted leftward such that the first and second pairs of the jaws 22a–22b and 24a–24b are positioned above the container 44 which is now covered by the lid 46. Following this, as shown in FIG. 6, the carrier 48 is transferred on the table 14 while being covered by the lid 46. Subsequently, as shown in FIG. 7, the lid 46 is placed on top of the container 44 while the carrier 48 is positioned on the table 14. The wafers 50, accommodated in the carrier 48, are removed on a one-by-one basis (usually) and transferred to a next wafer processing station (not shown).

The distance between the tables 12 and 14 is not fixed but can be changed depending on practical requirements. That is, the table 12 is separated from the table 14 by an arbitrary amount such as 5 m, 10 m, 20 m, etc. merely by way of example.

In the case where it is not necessary to separate the tables 12 and 14, it is sufficient if only one table is provided. This manner is shown in FIG. 8 wherein the only one table is depicted by reference numeral 90.

Referring now to FIGS. 9A–9L, a description will be made of a sequential operation of the wafer carrier handling apparatus.

Figure 9A:
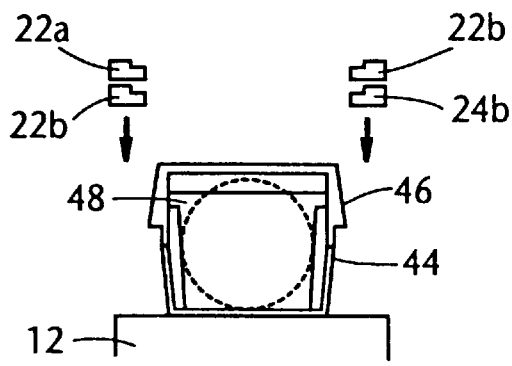
FIGS. 9A–9L are illustrations describing sequential operations of the apparatus shown in FIGS. 1 and 2.
Figure 9D:
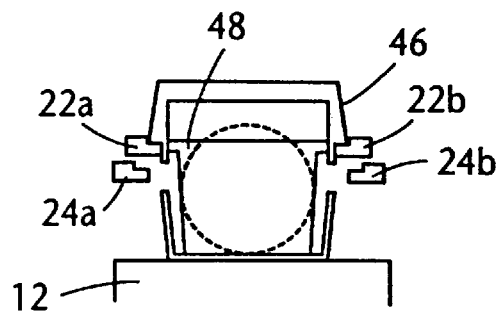
Figure 9B:
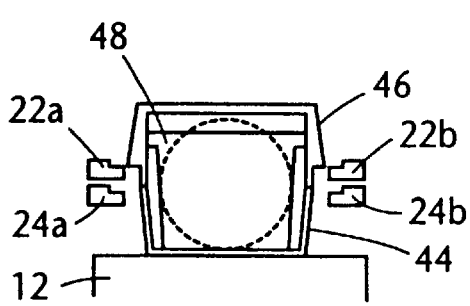

When the motor 52 (shown in FIG. 4) is driven such as to lower the base 60, both the pairs of jaws 22a–22b and 24a–24b move downward as indicated by the arrows in FIG. 9A. Thus, the jaws 22a–22b and 24a–24b are lowered to a position lower than that of the edge of the lid 46 as shown in FIG. 9B. Subsequently, as shown in FIG. 9C, the piston rod 70 of the air cylinder device 66 (shown in FIG. 4) protrudes in a manner where the first pair of jaws 22a–22b move inwardly to grasp the lid 46 at the edge thereof. In this instance, the jaw vertically moving mechanism 32 is driven so that the first and second pairs of jaws 22a–22b and 24a–24b slightly rise in order to slightly lift the lid 30 by the first pair of jaws 22a–22b, as shown in FIG. 9D.

Figure 9E:
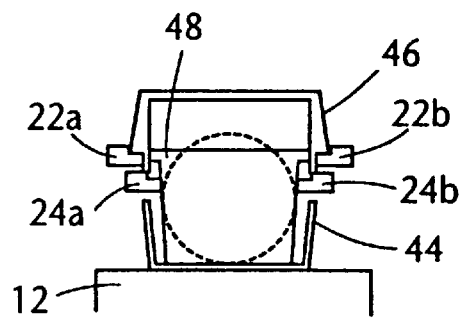
Figure 9C:
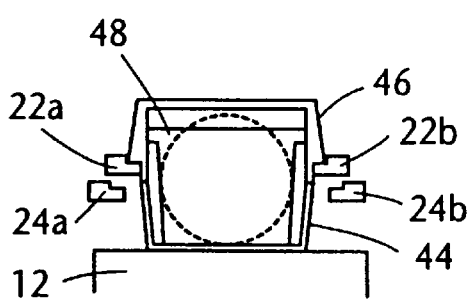
Figure 9F:
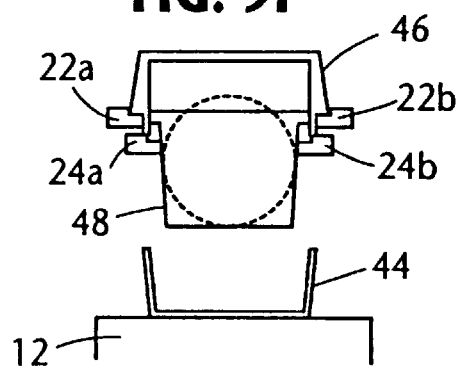
Figure 9G:
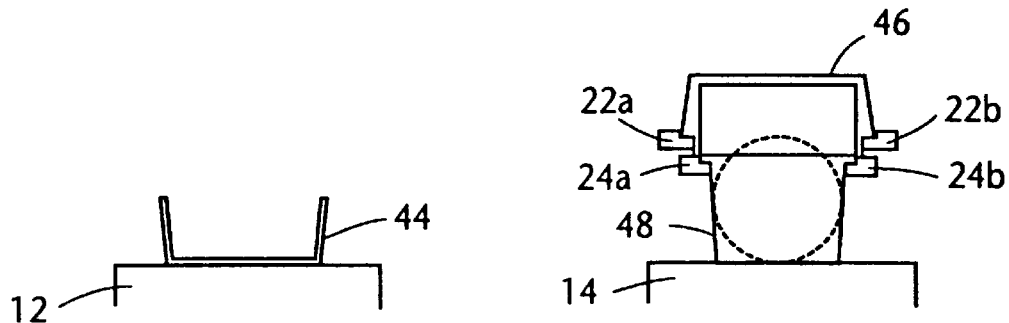

Following this, the piston rod 72 of the air cylinder device 68 of FIG. 4 is lowered to move the second pair of jaws 24a–24b inwardly whereby the jaws in question are brought into contact with side surface of the carrier 48 as shown in FIG. 9E. After this, as shown in FIG. 9F, the carrier 48 and the lid 46, gripped by the first and second pairs of jaws 22a–22b and 24a–24b, are lifted so that the carrier 44 is removed from the container 44. At this time, the opening portion of the carrier 48 is maintained closed by the lid 30 whereby the wafers within the carrier 32 are prevented from being subjected to the dust contamination.

Figure 9H:
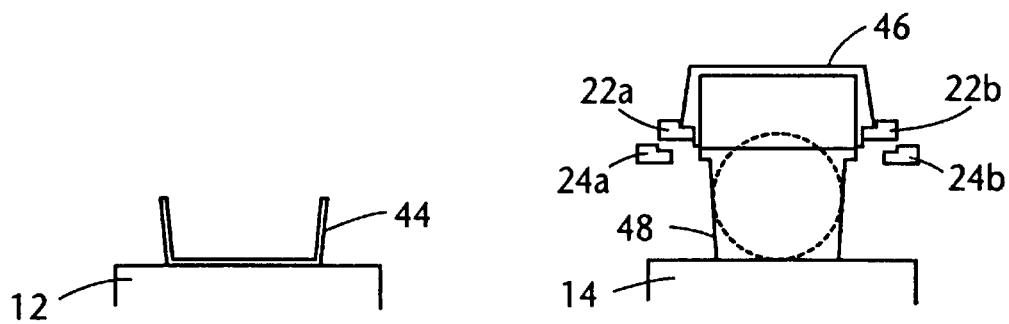
Figure 9I:
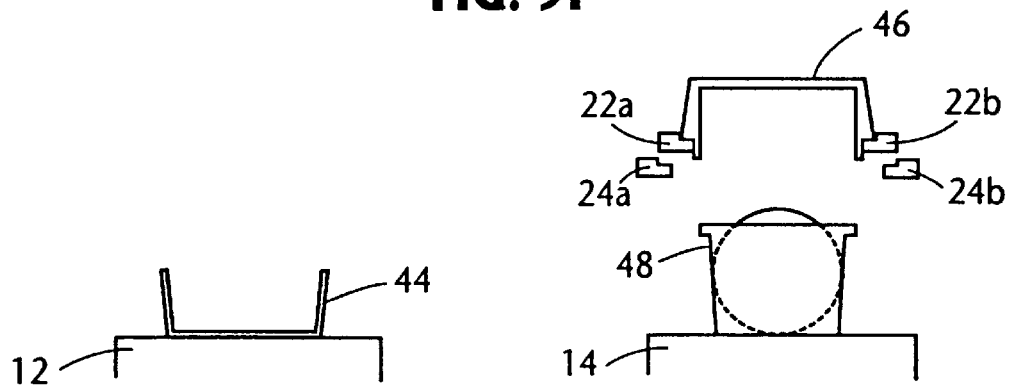
Figure 9J:
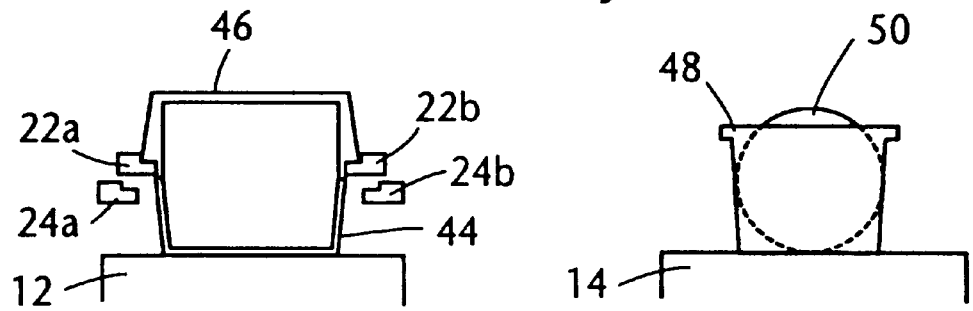
Figure 9K:
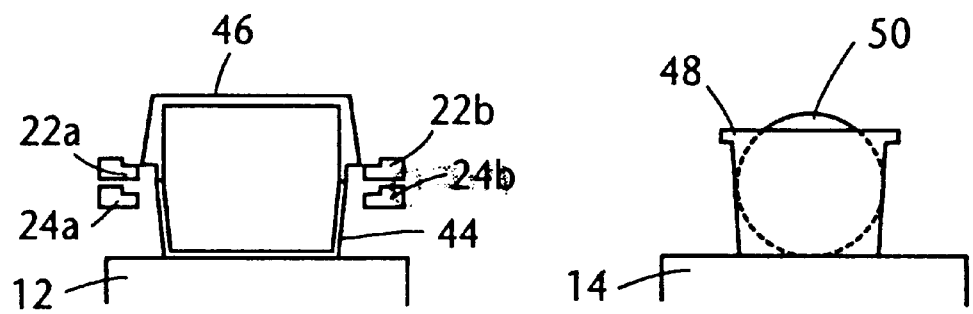
Figure 9L:
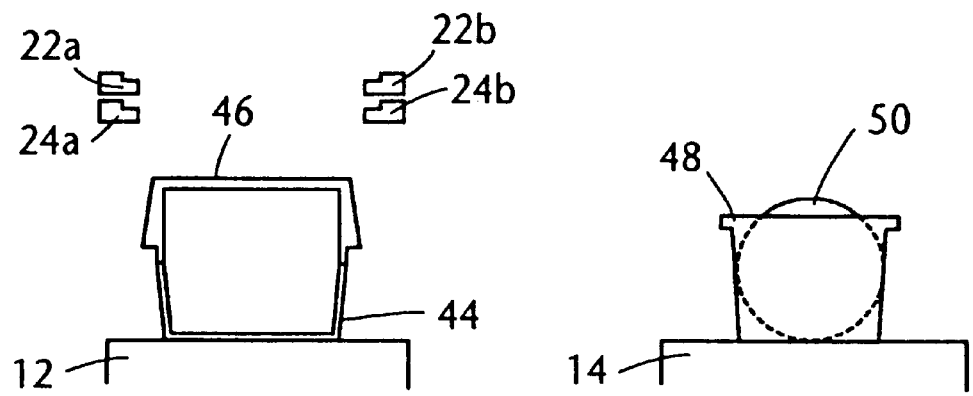

Subsequently, through the use of the traveling mechanism 34, the carrier 48, which is maintained closed by the lid 46, is shifted to a position over the table 14. Following this, through the use of the jaw vertically moving mechanism 32, the first and second pairs of jaws 22a–22b and 24a–24b are moved downward thereby lowering the carrier 48 together with the lid 46 to set them on the table 14 in the manner shown in FIG. 9G. It is to be noted that the container 44 is left on the table 12. Subsequently, the piston rod 72 of the air cylinder device 68 is pulled downward to open the second pair of jaws 24a–24b as shown in FIG. 9H. Thereafter, the first and second pairs of jaws 22a–22b and 24a–24b are shifted upwardly to lift the lid 46 away from the carrier 48 as illustrated in FIG. 9I. Following this, the lid 46 is shifted across and then placed on the container 44 as shown in FIG. 49J. Thereafter, the piston rod 70 of the air cylinder device 66 of FIG. 4 is retracted so that the first pair of jaws 22a–22b are opened as shown in FIG. 9K. After this, the first and second pairs of jaws 22a–22b and 24a–24b are lifted to from the container 44 as shown in FIG. 9L, with the result that the empty box 31 is left closed by the lid 46.

In the above description, the carrier 48 is removed from the container 44. However, the present invention is also applicable to a case wherein the carrier 48 is deposited in the container 44. It can readily be understood that such a reverse operation can be carried out along the reverse order of the operations shown in FIGS. 9A–9L.

The above mentioned operations are controlled by a software stored in the sequence controller 51 shown in FIG. 2. It is without saying that if the distance between the tables 12 and 14 is changed, the soft ware can readily changed so as to match the distance change.

It should be understood that the foregoing description is only illustrative of the present invention and that various alternatives and modification can be devised by those skilled in the art without departing from its scope.

What is claimed is:

1. A method of handling a carrier, comprising the steps of:

grasping a lid which closes a container with a first pair of jaws;

grasping a carrier which is disposed in the container with a second pair of jaws;

moving the first and second pairs of jaws vertically upward to simultaneously lift the lid and the carrier upward from the container, in a manner wherein the lid remains on top of the carrier obviating dust contamination of items carried in the carrier;

moving the first and second pairs of jaws laterally to move the lid and the carrier to a position located above a predetermined site;

lowering the first and second pairs of jaws until the carrier rests on the predetermined site;

releasing the second pair of jaws while maintaining the first pair of jaws in a closed condition wherein the lid remains gripped thereby;

moving the first and second pairs of jaws to a position located above the container; and lowering the first and second pairs of jaws until the lid sits on top of the container in a manner wherein it again closes the container.

2. A carrier handling apparatus comprising:

a first pair of jaws and a second pair of jaws, said first pair of jaws being able to grasp a lid of a container, said second pair of jaws being able to grasp a carrier disposed in the container;

column means adapted to be moved laterally along a predetermined path and for supporting the first and second pairs of jaws;

jaw vertically moving means for lifting and lowering the first pair and second pair of jaws along said column means;

jaw control means for opening and closing one of said first pair and second pair of jaws while maintaining a fixed position of the other of said first pair and second pair of jaws;

control means operatively connected with said jaw vertically moving means and with said jaw control means for controlling the apparatus to:

move the first and second pairs of jaws vertically upward;

move the first and second pairs of jaws laterally;

lower the first and second pairs of jaws; and release the second pair of jaws while maintaining the first pair of jaws in a closed condition.

3. A carrier handling apparatus comprising:

a first pair of jaws and a second pair of jaws, said first pair of jaws being able to grasp a lid of a container, said second pair of jaws being able to grasp a carrier disposed in the container;

column means adapted to be moved laterally along a predetermined path and for supporting the first and second pairs of jaws;

jaw vertically moving means for lifting and lowering the first pair and second pair of jaws along said column means; and jaw control means for opening and closing one of said first pair and second pair of jaws while maintaining a fixed position of the other of said first pair and second pair of jaws.

* * * * *